United States Patent
Fucetola et al.

(10) Patent No.: US 9,359,198 B2
(45) Date of Patent: Jun. 7, 2016

(54) CARRIER-SUBSTRATE ADHESIVE SYSTEM

(71) Applicant: Massachusetts Institute of Technology, Cambridge, MA (US)

(72) Inventors: Corey Patrick Fucetola, Somerville, MA (US); Henry Ignatius Smith, Sudbury, MA (US); Jay J. Fucetola, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 7 days.

(21) Appl. No.: 14/459,879

(22) Filed: Aug. 14, 2014

(65) Prior Publication Data
US 2015/0053337 A1    Feb. 26, 2015

Related U.S. Application Data

(60) Provisional application No. 61/868,765, filed on Aug. 22, 2013, provisional application No. 62/004,549, filed on May 29, 2014.

(51) Int. Cl.
*B29C 65/52*    (2006.01)
*B32B 37/06*    (2006.01)
(Continued)

(52) U.S. Cl.
CPC ............. *B82Y 10/00* (2013.01); *H01L 21/6835* (2013.01); *B32B 2457/00* (2013.01); *B32B 2551/00* (2013.01); *H01L 2221/68327* (2013.01);
(Continued)

(58) Field of Classification Search
USPC ............... 156/247, 249, 307.3, 701, 711, 713
See application file for complete search history.

(56) References Cited

U.S. PATENT DOCUMENTS 4,070,117 A  *  1/1978  Johannsmeier ....... G06T 1/0014
                                                    250/237 R
5,459,351 A      10/1995  Bender
(Continued)

FOREIGN PATENT DOCUMENTS

| CA | 2314183 C | 10/2006 |
|---|---|---|
| JP | 1-208842 A | 8/1989 |
| JP | 10-4206 A | 1/1998 |

OTHER PUBLICATIONS

International Search Report and Written Opinion mailed Nov. 17, 2014 in corresponding PCT application No. PCT/US14/51181.
(Continued)

*Primary Examiner* — Sing P Chan
(74) *Attorney, Agent, or Firm* — Nields, Lemack & Frame, LLC

(57) ABSTRACT

A system and method for creating three-dimensional nanostructures is disclosed. The system includes a substrate bonded to a carrier using a bonding agent. The bonding agent may be vaporizable or sublimable. The carrier may be a glass or glass-like substance. In some embodiments, the carrier may be permeable having one or a plurality of pores through which the bonding agent may escape when converted to a gaseous state with heat, pressure, light or other methods. A substrate is bonded to the carrier using the bonding agent. The substrate is then processed to form a membrane. This processing may include grinding, polishing, etching, patterning, or other steps. The processed membrane is then aligned and affixed to a receiving substrate, or a previously deposited membrane. Once properly attached, the bonding agent is then heated, depressurized or otherwise caused to sublime or vaporize, thereby releasing the processed membrane from the carrier.

30 Claims, 6 Drawing Sheets

(51) Int. Cl.
  *B32B 38/10* (2006.01)
  *B82Y 10/00* (2011.01)
  *H01L 21/683* (2006.01)

(52) U.S. Cl.
  CPC .............. *H01L 2221/68368* (2013.01); *H01L 2221/68381* (2013.01)

(56) References Cited

U.S. PATENT DOCUMENTS

| | | | |
|---|---|---|---|
| 6,214,520 | B1 | 4/2001 | Wolk et al. |
| 7,262,444 | B2 | 8/2007 | Fillion et al. |
| 7,708,854 | B2 * | 5/2010 | Kroninger .............. B23Q 3/084 156/247 |
| 7,829,386 | B2 | 11/2010 | Fillion et al. |
| 7,884,032 | B2 | 2/2011 | Ye et al. |
| 7,901,532 | B2 | 3/2011 | Bain et al. |
| 7,993,969 | B2 | 8/2011 | Pohl et al. |
| 2004/0009649 | A1 * | 1/2004 | Kub ....................... B82Y 30/00 438/459 |
| 2009/0266418 | A1 | 10/2009 | Hu et al. |
| 2011/0171559 | A1 | 7/2011 | Zhang et al. |
| 2014/0144593 | A1 * | 5/2014 | Dang ................ H01L 21/02002 156/712 |

OTHER PUBLICATIONS

Journal of Vacuum Science & Technology B, vol. 29(6), Sep./Oct. 2011, 06F401, pp. 06F401-1 through 06F401-3, "3D nanostructures by stacking pre-patterned fluid-supported single-crystal Si membranes", 5 pages, Ghadarghadr, et al.

Journal of Vacuum Science & Technology B, vol. 29(6), Nov./Dec. 2011, 06F402, pp. 06F402-1 through 06F401-3, "3D fabrication by stacking prepatterned, rigidly held membranes", 3 pages, Patel, et al.

* cited by examiner

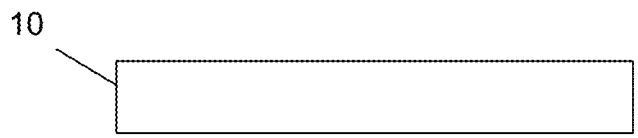
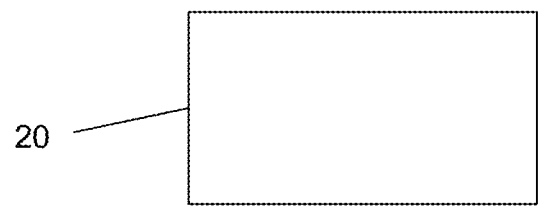
Fig 1A
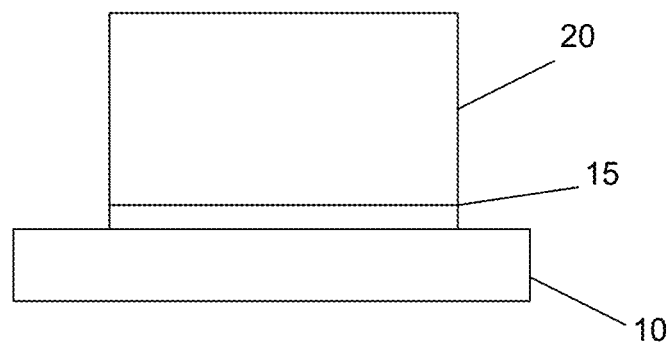
Fig 1B

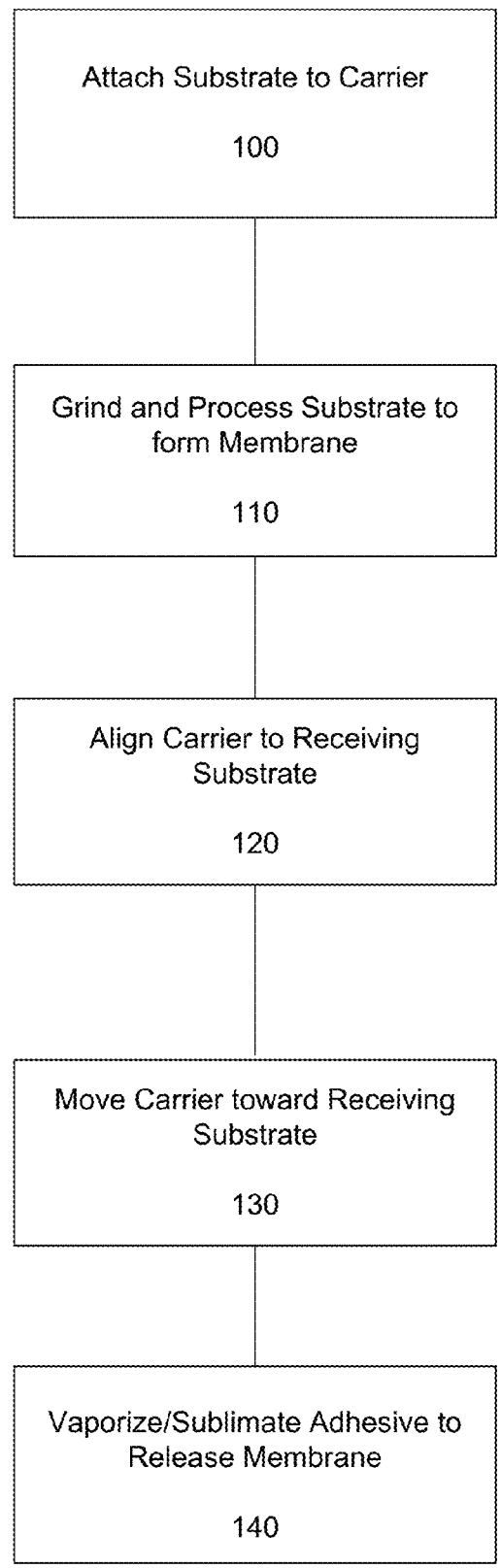

CARRIER-SUBSTRATE ADHESIVE SYSTEM

This application claims priority of U.S. Provisional Patent Application Ser. No. 61/868,765 filed Aug. 22, 2013 and U.S. Provisional Patent Application Ser. No. 62/004,549 filed May 29, 2014, the disclosures of which are incorporated herein by reference in their entireties.

This invention was made with government support under Grant No. FA9550-08-1-0379 awarded by the Air Force Office of Scientific Research. The government has certain rights in the invention.

BACKGROUND

Three dimensional nanostructures have utility in various applications, such as photonic crystals with embedded devices, three-dimensional integrated semiconductor electronics, three-dimensional semiconductor memory, tissue scaffolds, graded-optical-index components, heterogeneous single-crystal lattice-mismatched structures and others.

In some embodiments, these three-dimensional nanostructures are fabricated by aligning and stacking pre-patterned membranes on top of one another. Typically, some of these membranes are patterned. This patterning may include the introduction of pores, regions of implanted chemical elements, electronic or photonic devices, or other structures. Additionally, the patterning may include dividing the membrane into a plurality of disjoint portions.

Various techniques have been described to stack patterned membranes. For example, each membrane may be disposed on a frame. In such an embodiment, a membrane may be coupled to the outer frame through the use of cleavage points. The patterned membrane, with the attached frame, is aligned to a substrate or a previously deposited membrane. Once aligned, the cleavage points can be severed, thereby separating the frame from the membrane.

However, while this technique may be acceptable in certain applications, it may not be suitable for membranes with compressive stress or for disjoint membranes.

Therefore, it would be beneficial if there were an improved carrier system for transporting and aligning membranes to create three dimensional nanostructures.

SUMMARY

A system and method for creating three-dimensional nanostructures is disclosed. The system includes a substrate bonded to a carrier using a bonding agent that is either vaporizable or sublimable. The carrier may be a glass or glass-like substance. In some embodiments, the carrier may be permeable. For example, the carrier may have one or more pores through which the bonding agent may escape when heated or otherwise converted to a gas. A substrate, such as silicon, is bonded to the carrier using the bonding agent. The substrate is then processed to form a desired membrane. This processing may include grinding, polishing and patterning via lithographic means and etching, or other means of patterning. The processed membrane is then aligned to a receiving substrate, or a previously deposited membrane. Once properly aligned, the bonding agent is then heated, depressurized or otherwise caused to sublime or vaporize, thereby releasing the processed membrane from the carrier. This process may be repeated a plurality of times to build a desired stack of membranes.

In one embodiment, the method of creating a three dimensional nanostructure comprises attaching a substrate to be processed to a carrier using a bonding agent; thinning and processing the substrate to form a membrane; aligning the carrier with the attached membrane to a receiving substrate; contacting the membrane with the receiving substrate or a previously deposited membrane disposed on the receiving substrate; and vaporizing or sublimating the bonding agent to release the membrane from the carrier.

In another embodiment, the method of creating a three dimensional nanostructure comprises attaching a substrate to be processed to a permeable carrier using a bonding agent; thinning and processing the substrate to form a membrane; aligning the carrier and the attached membrane to a receiving substrate; contacting the membrane with the receiving substrate or a previously deposited membrane disposed on the receiving substrate; and causing the bonding agent to transition from a solid to a gas in order to release the membrane from the carrier, wherein gasses from the bonding agent pass into or through the permeable carrier.

BRIEF DESCRIPTION OF THE FIGURES

For a better understanding of the present disclosure, reference is made to the accompanying drawings, which are incorporated herein by reference and in which:

FIG. 1A shows the carrier and substrate prior to attachment;

FIG. 1B shows the substrate bonded to the carrier;

FIG. 4 shows a flowchart in accordance with one embodiment;

DETAILED DESCRIPTION

A substrate is affixed to a carrier and then processed to create a membrane. This membrane can then be stacked on top of a receiving substrate or other previously deposited membranes to create a three-dimensional nanostructure.

FIG. 1A shows a carrier 10 and a substrate 20 prior to processing. The carrier 10 may be any semirigid amorphous or crystalline material or composite. In some embodiments, the carrier 10 may be a flexible glass or similar material. The dimensions of the carrier 10 may vary. For example, its length and width may be based on the size of the membrane that is being created. In one embodiment, the carrier 10 may have a 25 mm diameter, although other dimensions are within the scope of the disclosure. The thickness of the carrier 10 may also be varied, but in some embodiments, may be between 1 mm and 10 mm, although other thicknesses are also possible.

Figure 5:
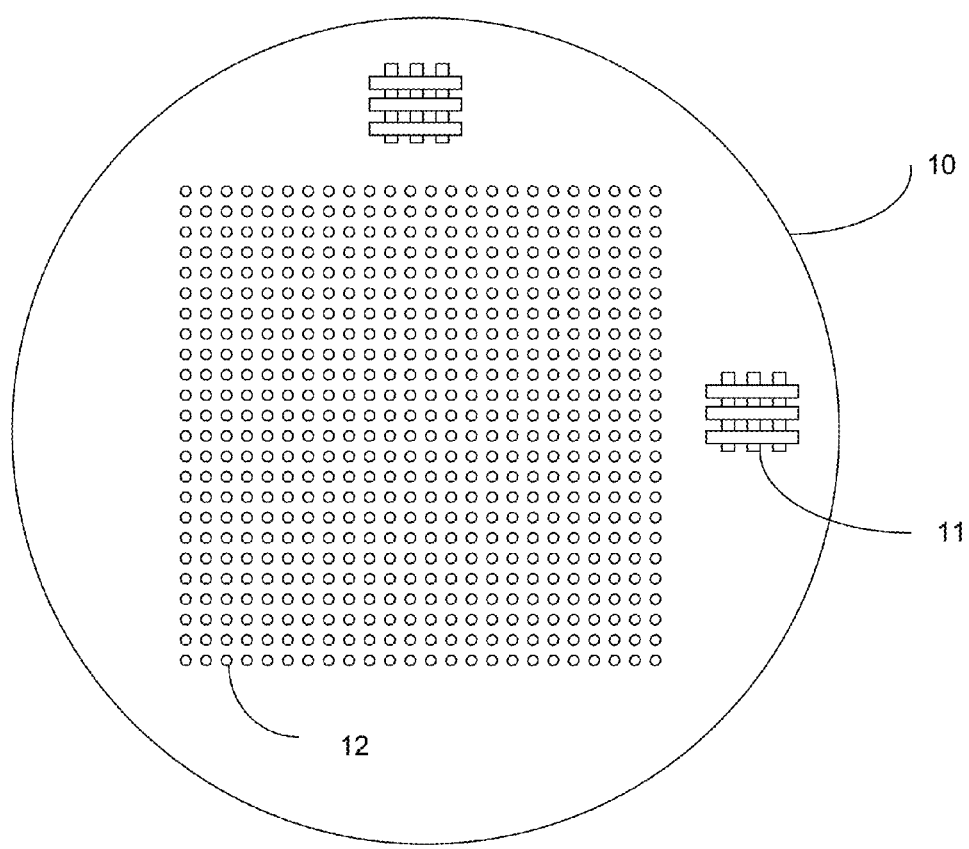
FIG. 5 shows a porous carrier in accordance with one embodiment.
Figure 6:
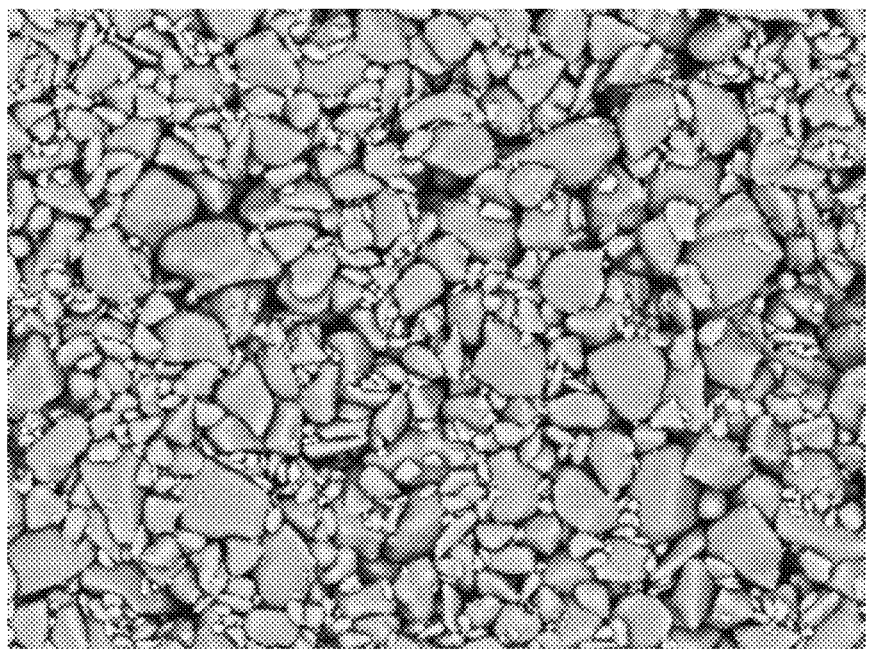
FIG. 6 shows a close-up view of a material that may be used as a carrier in accordance with one embodiment.

In some embodiments, the carrier 10 may be permeable. In one embodiment, the permeability of the carrier 10 may be greater than $1\times10^{-2}$ millidarcy. The permeable carrier 10 may be of various construction and material. For example, in one embodiment, the carrier 10 contains one or more pores 12 that extend through the thickness of the carrier 10, as shown in FIG. 5. These pores 12 may have a diameter in the range of nanometers to hundreds of micrometers, although this diameter may vary. The porosity of the carrier 10 may be greater than 20%. In some embodiments, the porosity is greater than 50%. The purpose of the pores 12 will be described in more detail below.

In another embodiment, the carrier 10 is porous by virtue of being composed of a material that comprises particles that contact one another only at limited points, leaving pathways between particles large enough to enable gasses to pass through the carrier. For example, FIG. 5 shows a view of such a material, which, in this embodiment, is sintered glass. FIG. 5 shows a close-up view of the material so that the pathways between the particles are visible. Of course, other materials that include pathways between particles may be used, and the disclosure is not limited to this or any other particular material.

In another embodiment, the carrier 10 may be made of a material that is permeable without having pores and pathways. For example, materials such as polydimethylsiloxane (PDMS) are permeable to gas. Of course, other materials may also have this property and the disclosure is not limited to any particular material.

Thus, the term "permeable carrier" refers to any material that allows the passage of the gaseous form of the bonding agent. This permeability may be achieved in a variety of ways; some of which are described above. However, other permeable carriers are also within the scope of the disclosure.

The substrate 20 may be any suitable material or composite, and may be a semiconductor material. In some embodiments, the substrate may already contain patterned microstructures. In certain embodiments, the substrate 20 may be a silicon substrate. The dimensions of the substrate 20 before processing may vary. In some embodiments, the substrate 20 is of a size that is convenient to handle and is not susceptible to breakage. For example, in some embodiments, the diameter of the substrate 20 before processing may be about 1 cm. In some embodiments, the substrate 20 may be much larger, measuring tens of centimeters across. The thickness of the substrate before processing may be about half a millimeter, or it may be thicker or thinner.

The substrate 20 is then affixed to the carrier 10 using a bonding agent 15, as shown in FIG. 1B. This bonding agent 15 may be an adhesive, or a plurality of adhesive layers, that is vaporizable or sublimable. The term "vaporizable" is used to designate materials that can readily make a transition to the gaseous state. The term "sublimable" is used to designate materials that can transition directly from the solid state to the gaseous state without first melting. In one embodiment, a liquid bonding agent, when heated, depressurized or otherwise stimulated, transitions into a gaseous phase. In another embodiment, a solid bonding agent, when heated, depressurized or otherwise stimulated, transitions by first melting into a liquid and then evaporating into a gaseous phase. In another embodiment, a solid bonding agent, when heated, depressurized or otherwise stimulated, sublimates directly into a gaseous phase.

The bonding agent 15 may be applied to the carrier 10 in a number of different ways, such as evaporation, spin coating and drop casting. In another embodiment, a soluble gel (sol-gel) may be cured on a substrate 20 that was pre-coated with the bonding agent 15. Other techniques may also be used and are not limited by the disclosure.

Figure 2A:
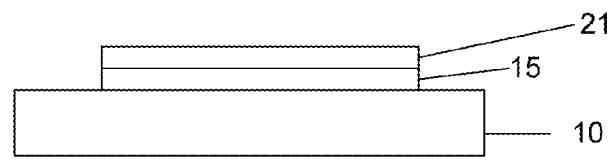
FIG. 2A shows a membrane bonded to the carrier after grinding.

Once the substrate 20 is affixed to the carrier 10 using the bonding agent 15, the bonding agent 15 may solidify. The substrate 20 can then be processed. The substrate 20 may be thinned to reduce its thickness. For example, the substrate 20 may be ground and polished so as to reduce its thickness, as shown in FIG. 2A. In another embodiment, the substrate 20 may be exfoliated to cleave thin membrane layers from the substrate. In another embodiment, the substrate 20 may be etched to form a membrane of the desired thickness. When the thinning process is completed, the substrate 20 may have a thickness of about 300 nm, although other dimensions are also possible. The substrate 20, once thinned, may be referred to as a membrane 21.

The membrane 21 may be further processed, if desired. For example, a process of lithography and etching may be used to create a pattern on the membrane 21, as shown in FIG. 2C. This patterning may be used to create structures of various types in the membrane 21, or may be used to separate the membrane 21 into a plurality of disjoint portions 22, as shown in FIG. 2C. For example, the substrate may be further processed to create a pattern or complex microstructures within or on the membrane. These microstructures may include electronic, mechanical and photonic devices. The types of microstructures that may be created are not limited by this disclosure.

Figure 2B:
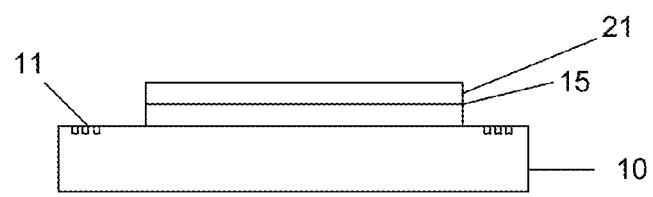
FIG. 2B shows the membrane of FIG. 2A after patterning.
Figure 2C:
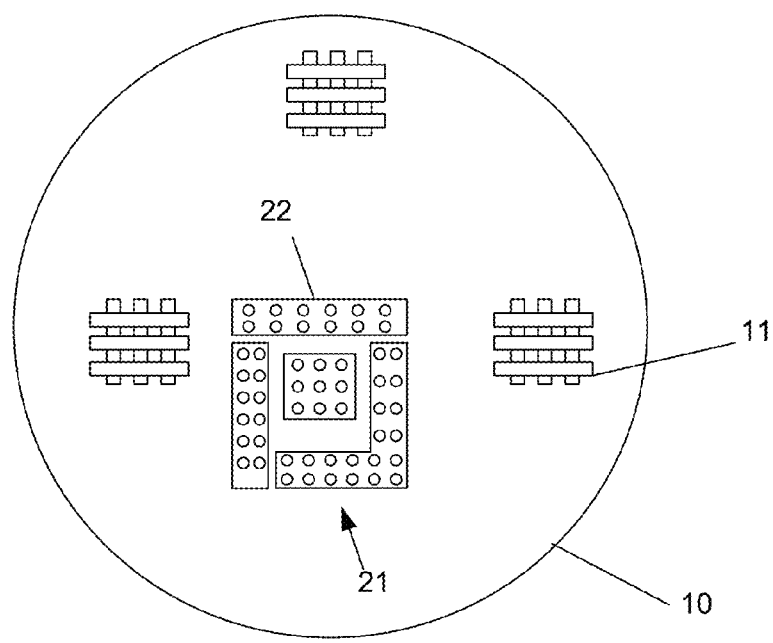
FIG. 2C shows a top view of the membrane of FIG. 2B.

Additionally, while the membrane 21 is being patterned with its microstructures, the carrier 10 and/or membrane 21 may also be patterned to create alignment marks 11, as shown in FIGS. 2B and 2C. In this embodiment, the alignment marks 11 are created to have a known spatial relationship with respect to the patterning of the membrane 21. These alignment marks 11 serve to align the patterned membrane 21 with respect to the receiving substrate, as described in greater detail below.

In another embodiment, the alignment marks 11 may already be present on the carrier 10 prior to the patterning of the membrane 21. In such an embodiment, the patterning of the membrane 21 may be performed using the pre-existing alignment marks 11 as a guide. In other words, the patterning is performed in such a way so as to be aligned with respect to the pre-existing alignment marks 11.

As shown in FIGS. 2B and 2C, the alignment marks 11 may be etched into the carrier 10. However, in other embodiments, the alignment marks 11 may be disposed on the carrier 10 in other ways, for example as a relief pattern or as a metallic pattern. The alignment marks 11 may also be disposed on or etched into disjoint portions 22.

In some embodiments, the alignment marks 11 are created so as to be able to align the carrier 10 to the receiving substrate in at least two orthogonal directions.

A three-dimensional structure is constructed on a receiving substrate. This receiving substrate may have alignment marks that are intended to align with the alignment marks 11 on the carrier 10, as described below.

Figure 3A:
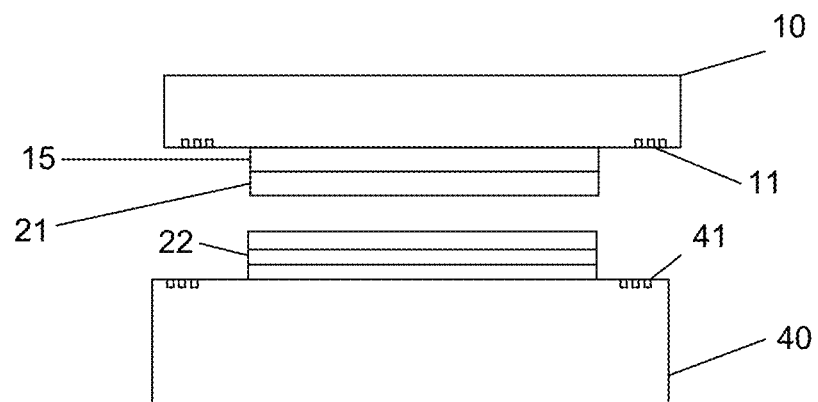
FIG. 3A shows the membrane and carrier of FIG. 2B as it is aligned to a receiving substrate.

FIG. 3A shows a receiving substrate 40 having a stack 23 of membranes already disposed thereon. The receiving substrate 40 also has alignment marks 41, which align to the carrier 10.

Each membrane 21 is deposited on the receiving substrate 40 as follows. First, the substrate 20 is affixed to the carrier 10 using a bonding agent 15. The substrate 20 is then thinned and processed to create the membrane 21 and any patterns thereon or therein. As described above, alignment marks 11 are disposed on the carrier 10 to have a fixed and known spatial relationship with respect to the pattern on the membrane 21. The alignment marks 11 may either be created during the membrane patterning process, or may pre-exist.

The carrier 10 is then transported and disposed proximate to the receiving substrate 40, as shown in FIG. 3A. In one embodiment, the carrier 10 is disposed with the membrane 21 oriented downward above the receiving substrate 40. The carrier 10 is then aligned to the receiving substrate 40, using alignment marks 11 and 41. As described above, in some embodiments, the alignment marks 11 and 41 allow alignment in at least two orthogonal directions. In this scenario, the carrier 10 may be capable of movement in all six degrees of freedom, including three translation axes and two rotation axes. In other embodiments, alignment may be performed in fewer directions. For example, in one embodiment, the alignment marks 11, 41 allow alignment in at least one direction.

Alignment may be performed in a number of ways. In some embodiments, an optical alignment process, shown as those known in the art, is used to align the carrier 10 to the receiving substrate 40. Of course, other methods of alignment may also be used.

The carrier 10 is then moved so that the membrane 21 contacts the receiving substrate 40. In the case where a stack 23 of one or more membranes 21 have already been placed on the receiving substrate 40, the new membrane 21 is lowered onto the existing stack 23 of membranes (see FIG. 3A). While FIG. 3A shows the membrane 21 being lowered onto the receiving substrate 40, other embodiments are possible. For example, the carrier 10 may be disposed beneath the receiving substrate 40 and lifted to deposit the membrane 21 on the receiving substrate 40. Any orientation of the carrier 10 and receiving substrate 40, which allows the carrier 10 to be positioned and aligned relative to the receiving substrate 40 so that the membrane 21 can be detached from the carrier 10 and deposited onto the receiving substrate 40 is within the scope of this disclosure.

The membrane 21 may be attached to the receiving substrate 40 or the stack 23 by optionally using surface-to-surface contact bonding, so-called Van der Waals bonds, followed by additional thermal processes that improve the attachment of the membrane 21 to the receiving substrate 40. In one embodiment, when annealing silicon membranes 21 in contact with one another above 300° C. for several minutes, quasi-covalent bonds may form between the contacting membranes 21. In another embodiment, an adhesive may be used to affix the membrane 21 to the receiving substrate 40 or the stack 23 of membranes. In other embodiments, solder bumps may be used to connect vias in adjacent membranes 21.

Figure 3B:
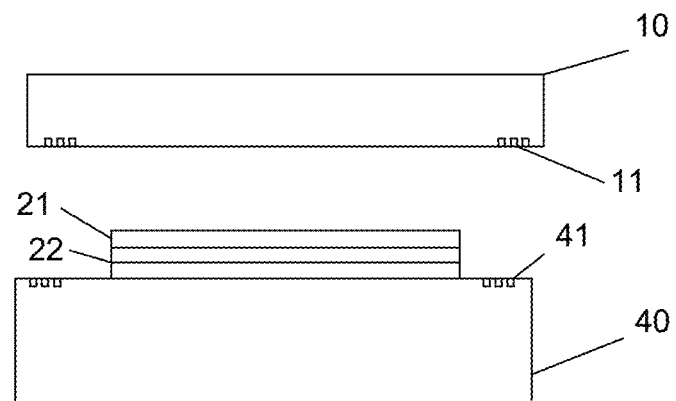
FIG. 3B shows the nanostructure created after membrane is stacked.

Once the membrane 21 is properly positioned, the bonding agent 15 is then removed from between the membrane 21 and the carrier 10. This may be done by heating the bonding agent 15 so that it vaporizes or sublimes. Alternatively, the pressure of the local atmosphere may be lowered so as to accelerate the process of vaporization or sublimation. In some embodiments, the bonding agent 15 may be otherwise stimulated. For example, electromagnetic radiation, such as light, may be used to vaporize or accelerate the sublimation of the bonding agent 15. Any combination of mechanisms that causes the bonding agent 15 to change from a solid to a gas may be used to remove the bonding agent 15. The elimination of the bonding agent 15 causes the membrane 21 to separate from the carrier 10 and become stacked on the receiving substrate 40, as shown in FIG. 3B.

Pores 12 (see FIG. 5) in the carrier 10 allow the gas created by the vaporization or sublimation of the bonding agent 15 to pass through the carrier 10 easily. Without pores 12, the formation of the gaseous phase of the bonding agent 15 is impeded; any gasses that form may not be fully removed and remain trapped between the carrier 10 and the membrane 21, which may be an undesirable outcome.

Examples of vaporizable bonding agents include naphthalene, although other bonding agents may be used.

Vapor from a vaporizable bonding agent 15 may condense and create surface tension that inhibits or makes more difficult the separation of the membrane 21 from the carrier 10. The use of a sublimable adhesive eliminates the possibility of vapor condensing between the carrier 10 and the membrane 21 since sublimation is a direct conversion from solid to gas.

In some embodiments, a sublimable bonding agent may be used. The sublimable bonding agent may be naphthalene, anthracene, tetracene or pentacene. In some embodiments, any polyaromatic hydrocarbon having a sublimation point lower than its melting point may be used. Other bonding agents may also be sublimable and the disclosure is not limited to the above list.

FIG. 4 shows a process flow showing the creation of a 3 dimensional nanostructure. First, as shown in process 100, a substrate to be processed is attached to a carrier. The substrate to be processed is attached using a vaporizable or sublimable bonding agent. As described above, the substrate to be processed may be a semiconductor, such as silicon.

After the substrate to be processed has been attached to the carrier, it is thinned and/or processed, as shown in process 110. In one embodiment, the substrate is ground and polished to reduce its thickness to a desired thickness. In another embodiment, the substrate may be exfoliated to cleave thin membrane layers from the substrate. In another embodiment, the substrate may be etched to form a membrane of the desired thickness. Additionally, the substrate may be further processed to create a pattern or complex microstructures within or on the membrane. The types of microstructures may include electronic, mechanical and photonic devices and are not limited by this disclosure. The type of processing that is carried out to create patterns and microstructures on the substrate or the membrane is not limited by this disclosure.

After the substrate has been thinned and/or processed in other ways, it may be referred to as a membrane. This membrane remains affixed to the carrier by the bonding agent applied in process 100. The carrier with the processed membrane is then aligned to a receiving substrate, as shown in process 120. To do this, the carrier may be oriented so that the membrane is affixed to the bottom surface of the carrier. As stated above, in other embodiments, the receiving substrate is disposed above the carrier and the membrane is affixed to the top surface of the carrier. Any orientation in which the membrane is affixed to the carrier and is disposed between the carrier and the receiving substrate may be employed.

The carrier is then moved proximate to the receiving substrate. At least one of the carrier and the receiving substrate is moved relative to the other to achieve alignment. The carrier and the receiving substrate may both contain alignment marks to facilitate the alignment process. Alignment may be performed using a vision system or some other system.

Once aligned, the carrier is moved toward the receiving substrate, as shown in Process 130. Surface-to-surface contact bonding, often called van der Waals bonding, may be used to attach the membrane affixed to the carrier to the receiving substrate or to a previously attached membrane of a stack of membranes. Permanent adhesives and other adhesion-promoting materials may also be used during this attachment process. An anneal process may also be used to allow covalent bonds or quasi-covalent bonds to form between the membrane and the receiving substrate or another processed membrane. In some embodiments, the anneal process is performed after each membrane is added to the stack of membranes. In other embodiments, the anneal process is performed after the stack has been completed.

Once bonding between the membrane attached to the carrier and the receiving substrate, or between the membrane attached to the carrier and a membrane located on the receiving substrate, has occurred, the bonding agent is then caused to transition from a solid to a gas, as shown in Process 140. This may be through vaporization or sublimation. This may be done using pressure, temperature and/or electromagnetic radiation. The bonding agent, now in the form of a gas, may escape into and/or through pores in the carrier, facilitating the separation of the membrane from the carrier. In other embodiments, the gas escapes through the carrier, even though the carrier may not contain pores.

In one embodiment the carrier can then be used again to process another substrate into a membrane, allowing the processes 100-140 of FIG. 4 to be repeated. In another embodiment the carrier itself is disposable and thus discarded. While a first membrane may be deposited directly on a receiving substrate, subsequent membranes may be deposited on the previously attached membrane, thereby allowing a three dimensional structure to be constructed. The anneal process described above may facilitate the bonding of adjacent membranes to one another.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating a three dimensional nanostructure, comprising:
    attaching a substrate to be processed to a carrier using a vaporizable bonding agent;
    thinning and processing said substrate to form a membrane;
    aligning said carrier with said attached membrane to a receiving substrate;
    contacting said membrane with said receiving substrate or a previously deposited membrane disposed on said receiving substrate; and
    increasing temperature or lowering pressure of a local atmosphere to cause said bonding agent to vaporize, thereby releasing said membrane from said carrier.

2. The method of claim 1, wherein said processing comprises lithography and etching, and wherein complex microstructures are formed.

3. The method of claim 2, wherein said complex microstructures comprise electronic, mechanical or photonic devices.

4. The method of claim 1, further comprising annealing said membrane after said contacting to facilitate attachment of said membrane to said receiving substrate or said previously deposited membrane disposed on said receiving substrate.

5. The method of claim 1, wherein said carrier and said receiving substrate each comprise alignment marks, and wherein said aligning comprises using optical methods.

6. The method of claim 1, wherein the temperature is increased and the pressure is lowered.

7. A method of creating a three dimensional nanostructure, comprising:
    attaching a substrate to be processed to a permeable carrier using a bonding agent;
    thinning and processing said substrate to form a membrane;
    aligning said carrier and said attached membrane to a receiving substrate;
    contacting said membrane with said receiving substrate or a previously deposited membrane disposed on said receiving substrate; and
    causing said bonding agent to transition from a solid to a gas in order to release said membrane from said permeable carrier, wherein gasses from said bonding agent pass into or through said permeable carrier.

8. The method of claim 7, wherein said permeable carrier comprises pores therethrough.

9. The method of claim 8, wherein said permeable carrier has a porosity of greater than 20%.

10. The method of claim 8, wherein said permeable carrier has a porosity of greater than 50%.

11. The method of claim 7, wherein said permeable carrier has a permeability of greater than $1 \times 10^{-2}$ millidarcy.

12. The method of claim 7, wherein said permeable carrier comprises particles that contact one another only at limited points, leaving pathways between said particles through which gasses from said bonding agent pass.

13. The method of claim 7, wherein said processing comprising lithography and etching, and wherein complex microstructures are formed.

14. The method of claim 13, wherein said complex microstructures comprise electronic, mechanical or photonic devices.

15. The method of claim 7, further comprising annealing said membrane after said contacting to facilitate attachment of said membrane to said receiving substrate or said previously deposited membrane disposed on said receiving substrate.

16. The method of claim 7, further comprising repeating said attaching, thinning, aligning, contacting and causing steps a plurality of times until a stack of membranes is created.

17. The method of claim 16, further comprising annealing after said stack of membranes is created.

18. The method of claim 7, wherein said bonding agent is sublimable.

19. The method of claim 7, wherein said bonding agent is vaporizable.

20. A method of detaching a membrane attached to a permeable carrier with a bonding agent, comprising:
    causing said bonding agent to transition from a solid to a gas in order to release said membrane from said permeable carrier, wherein gasses from said bonding agent pass into or through said permeable carrier.

21. The method of claim 20, wherein said permeable carrier comprises pores therethrough.

22. The method of claim 21, wherein said permeable carrier has a porosity of greater than 20%.

23. The method of claim 21, wherein said permeable carrier has a porosity of greater than 50%.

24. The method of claim 20, wherein said permeable carrier has a permeability of greater than $1 \times 10^{-2}$ millidarcy.

25. The method of claim 20, wherein said permeable carrier comprises particles that contact one another only at limited points, leaving pathways between said particles through which gasses from said bonding agent pass.

26. The method of claim 20, wherein said bonding agent is sublimable.

27. The method of claim 20, wherein said bonding agent is vaporizable.

28. A method of detaching a material that is attached to a carrier using a vaporizable or sublimable bonding agent, comprising:
increasing temperature or lowering pressure of a local atmosphere to cause said bonding agent to transition to a gas, thereby releasing said material from said carrier.

29. The method of claim 28, wherein the temperature is increased and the pressure is lowered.

30. The method of claim 28, wherein the material is a semiconductor material.

\* \* \* \* \*